United States Patent [19]
Heigl

[11] Patent Number: 6,133,726
[45] Date of Patent: Oct. 17, 2000

[54] HANDLING DEVICE

[76] Inventor: Helmuth Heigl, Anemonenstrasse 3a, 83059 Kolbermoor, Germany

[21] Appl. No.: 09/070,403

[22] Filed: Apr. 30, 1998

[30] Foreign Application Priority Data

Apr. 30, 1997 [DE] Germany .......................... 197 18 398

[51] Int. Cl.[7] .............................. G01R 31/02; B25J 1/12
[52] U.S. Cl. ........................................ 324/158.1; 414/590
[58] Field of Search ................................ 324/158.1, 765; 73/866.5; 414/590

[56] References Cited

U.S. PATENT DOCUMENTS

| 4,527,942 | 7/1985 | Smith | 414/590 |
| 4,705,447 | 11/1987 | Smith | 414/590 |
| 5,241,870 | 9/1993 | Holt | 73/866.5 |
| 5,818,219 | 10/1998 | Hama et al. | 324/158.1 |

*Primary Examiner*—Ernest Karlsen
*Attorney, Agent, or Firm*—Herbert L. Lerner; Laurence A. Greenberg; Werner H. Stemer

[57] ABSTRACT

The handling device is particularly suited for handling the test heads on a wafer tester. The test head is thereby supported on a mount which is rotatable about its longitudinal axis on a supporting part. A frame column supports the supporting part adjustably in a vertical direction relative to the frame column via at least one linear bearing. A weight balancing device balances the weight of the head and the mount. The supporting part is configured such that the mount is laterally displayed relative to the frame column.

29 Claims, 4 Drawing Sheets

HANDLING DEVICE

BACKGROUND OF THE INVENTION

1. Field of the Invention

The present invention relates to a handling device, in particular to a device for handling the test heads of a wafer tester, including a mount for the test head disposed rotatably about its longitudinal axis on a supporting part, a frame column on which the supporting part is vertically adjustable relative to the frame column via at least one linear bearing and a weight balancing device for balancing the weight of the test head and the mount.

2. Description of the Related Art

A test head handling device of the above type is disclosed in applicant's German patent publication DE 195 17 330. That handling device comprises a mount for the test head which is vertically and horizontally adjustable relative to at least one vertical member. The mount is adjustably guided horizontally on a supporting part. The supporting part in turn is vertically guided adjustably on the at least one vertical member. Furthermore that handling device is provided with a weight balancing device for balancing the weight of the test head of the mount and of the supporting part. The weight balancing device includes balance weights and ribbed belts and guide pulleys connecting the weights to the supporting part.

High dimensional accuracy and good accessibility for adjusting the test head are required when the handling device is employed in known wafer testers. Since such wafer testers are put to use in a clean room environment they should have a minimum space requirement. Furthermore, good accessibility to the wafer tester is desirable, especially when to system is to be serviced.

SUMMARY OF THE INVENTION

It is accordingly an object of the invention to provide a handling device, which overcomes the disadvantages of the prior art devices and methods of this general type and which allows the test head to be adjusted relative to a wafer tester with high dimensional accuracy and smooth operation and which handling device has a minimum space requirement yet provides for good accessibility to the wafer tester.

With the foregoing and other objects in view there is provided, in accordance with the invention, a handling device, comprising:

a frame column;

at least one linear bearing on said frame column;

a supporting part connected to said at least one linear bearing and being vertically adjustable along said frame column;

a mount rotatably supported about a longitudinal axis thereof on said supporting part; and a weight balancing device for balancing a weight of a test head supported on said mount;

said supporting part being formed such that said mount is disposed laterally offset relative to said frame column.

In other words, the object of the invention is satisfied by a handling device of the above-mentioned kind in which the supporting part is such that the mount is laterally displaced relative to the frame column.

The advantages obtained by the invention are that the handling device is compact and space-saving, and it ensures that the wafer tester, for example, is very accessible for maintenance work and the like. Disposing the mount laterally enables the cable loom leaving the test head to be guided alongside the frame column. Accordingly, the cable loom no longer needs to be guided through the supporting structure of the frame column. This feature thus results in a simplification in the design of the handling device and thus in cost savings. The test head can thus be moved in a vertical plane arrangement laterally displaced relative to the frame column. In addition, the extent of the handling device horizontally is reduced, as a result of which the handling device is more compact and space-saving. Furthermore, due to the lateral guidance of the mount on the frame column superior stability of the handling device in accordance with the invention is achieved since the main weight of the mount and that of the test head is located in the immediate surroundings of the frame column.

In accordance with an additional feature of the invention, the supporting part includes a jib portion protruding laterally from the frame column. The mount is disposed on the jib portion.

In accordance with an added feature of the invention, the supporting part is guided by two linear bearings spaced away from each other on the frame column, the linear bearing rails and the slide guides being arranged alternatingly. Accordingly, in the case of the first linear bearing, for example the linear bearing rail, is arranged on the supporting part and the associated slide guide on the frame column whilst in the case of the second linear bearing an inverse arrangement is provided. This alternating arrangement enhances guidance stability. Advantageously the linear guide located nearer to the mount is longer since this substantially handles the resulting torques. In that case it is also expedient to arrange the linear guide rail on the supporting part while the slide guides are defined on the frame column. Due to the arrangement in accordance with the invention it is achieved that the mount and thus the test head too, can be elevated beyond the free end of the frame column. This has the advantage that the overall height of the handling device and more particularly that of the frame column can be reduced. Furthermore, this configuration of the linear bearings ensures that the test head is still guided dimensionally true on the frame column even in such an elevated condition of the mount. Being able to elevate the test head beyond the free end of the frame column is of advantage, for example, to servicing since all components of the frame column, test head or mount are freely accessible on all sides. In addition, the wafer tester is accessible on all sides in this position.

In accordance with another feature of the invention, the supporting part comprises a base portion guided by the frame column, the jib portion jutting from the base portion at an angle of preferably 90°.

In accordance with a further feature of the invention, the supporting part comprises a base portion guided by the frame column, the base portion being connected to the jib portion by a crank.

In accordance with again an additional feature of the invention, the supporting part comprises two mutually spaced apart vertical members, which differ in length.

In accordance with again an added feature of the invention, the supporting part may comprise at least one, preferably two horizontal members connected to the vertical members. Advantageously the supporting part may comprise two cross members spaced apart from each other connected to the horizontal members as well as to at least one of the vertical members.

In accordance with again another feature of the invention, there is provided at least one positioning element for locking the system in a defined position along the vertical movement direction. In this configuration the positioning element may be a manually actuated latch pin.

In accordance with again a further feature of the invention, the cable loom of the test head may be accommodated by a supporting ring swivably supported relative to the supporting part to minimize the mechanical load of the cable loom.

Expediently the cable loom may be supported between the supporting ring and the test head by further supporting means. Advantageously the cable loom is guided in the region of the test head by a mounting ring firmly clamping the cable loom in place. Furthermore, an intermediate support for the cable loom may be provided between the mounting ring and the supporting ring.

In yet another advantageous aspect the mount may be carried by a rotary bearing on the supporting part, the cable loom of the test head being guided through the inner opening of the supporting part. For this purpose the supporting part may comprise expediently a supporting plate arranged on the cross members and connected to the rotary bearing. In an advantageous aspect the supporting plate comprises an inner opening through which the cable loom is guided. Furthermore, the supporting plate may be carried swivably on the at least one cross member. Where two cross members are provided the supporting plate is swivelably carried by the upper cross member. In accordance with another aspect of the invention, the supporting plate may be a ring plate.

In accordance with yet an additional feature of the invention, the supporting plate is carried swivelably on the upper cross member via the rotary bearing. Advantageously the rotary bearing comprises a trunnion and a counterbearing, the trunnion being arranged on the supporting plate and the counter-bearing being disposed on the cross member.

Expediently to lock the supporting plate in the swiveling direction at least one locking element is provided. This locking element may consist of a manually actuatable positioning spindle.

In accordance with yet another feature of the invention, the horizontal members, the vertical members, and the cross members are made of metal. This ensures a cost-effective, simple means of manufacturing the individual supporting part components. The individual member elements are preferably welded to each other.

In accordance with yet again another feature of the invention, the mount is formed of two forks connected to each other by an end plate.

The two forks may thereby be formed with slots into which guide pins on the test head may engage. Expediently the guide pins may be provided with clamping means for locking the longitudinal position of the test head. This configuration of the forks in accordance with the invention enables the test head to be longitudinally adjustable within the mount.

In accordance with yet again an additional feature of the invention, the forks are provided with at least one mechanical connector for locking the test head to the wafer tester, the connecting means bringing and locking the test head and the wafer tester together.

Advantageously the weight balancing device is arranged within the frame column, as a result of which the space requirement of the handling device is further reduced.

In accordance with another feature of the invention, the weight balancing device comprises one or more balancing weights which are connected via at least one ribbed belt over a pulley to the supporting part. In accordance with a preferred feature of the invention, two ribbed belts are provided guided parallel to each other about a respective guide pulley.

Due to the weight balancing device as provided in accordance with the invention the weight on the adjustably arranged parts of the handling device is relieved, as a result of which controlling the test head relative to the wafer tester is assured dimensionally accurately. Due to the weight balancing device the full weight of the adjustable parts need not be moved in making the adjustment, so that the handling device is highly safe in operation. At the same time due to the special configuration of the weight balancing device within the frame column of the handling device a large weight may be used for a low overall height and minimum space requirement. The balance weights are preferably plate-shaped. Expediently the plate-shaped balance weights are arranged releasably in the weight balancing device. In this way the quantity of the weights needed can be set individually for each application.

In accordance with a further feature of the invention, the frame column comprises a base plate on which at least one jib is arranged, and the jib has at least one jib foot.

Using jibs makes for a simple as well as highly stable supporting structure for the handling device in accordance with the invention. Furthermore, due to the use of jibs, which are advantageously telescopic, a stable supporting system is created on all sides. The jibs are advantageously configured rod-like so that they take up little space in the floor region of the clean room in which the handling device is employed.

A particularly simple and safe means of adjusting the test head is achieved by assigning the supporting part or the weight balancing device a positioning drive. By way of example, the drive may be an electric or pneumatic drive. A separate drive may be provided for both the vertical movement of the supporting part and for the horizontal movement of the test head in the longitudinal direction thereof as well as for the swiveling movement of the mount.

In accordance with a concomitant feature of the invention, the drive is an electric drive cooperating with the guide pulley for the ribbed belts. Advantageously the electric drive is assigned an incremental control permitting dimensionally accurate adjustment of the test head.

Other features which are considered as characteristic for the invention are set forth in the appended claims.

Although the invention is illustrated and described herein as embodied in a handling device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
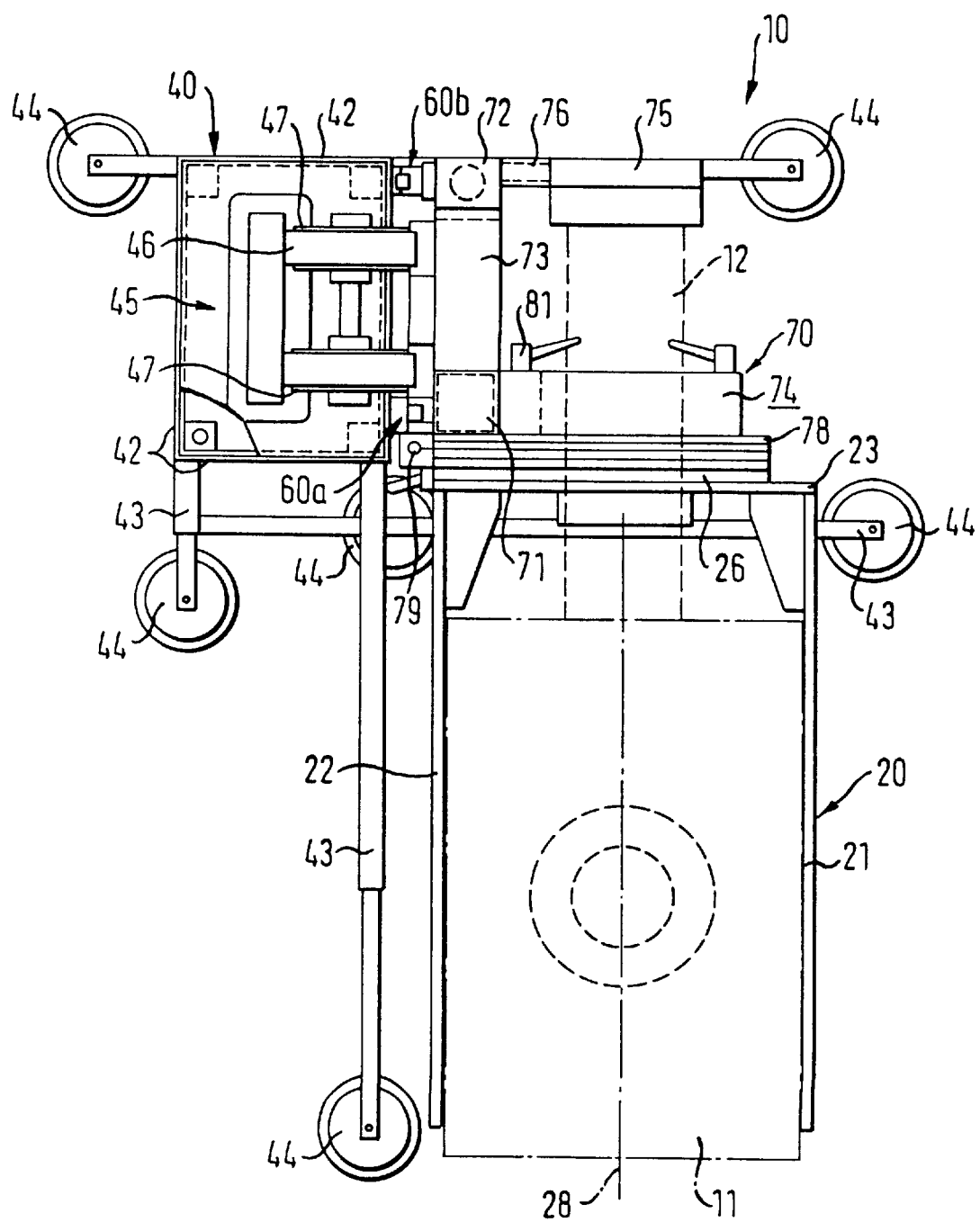
FIG. 1 is a plan view of the handling device in accordance with the invention.
Figure 2:
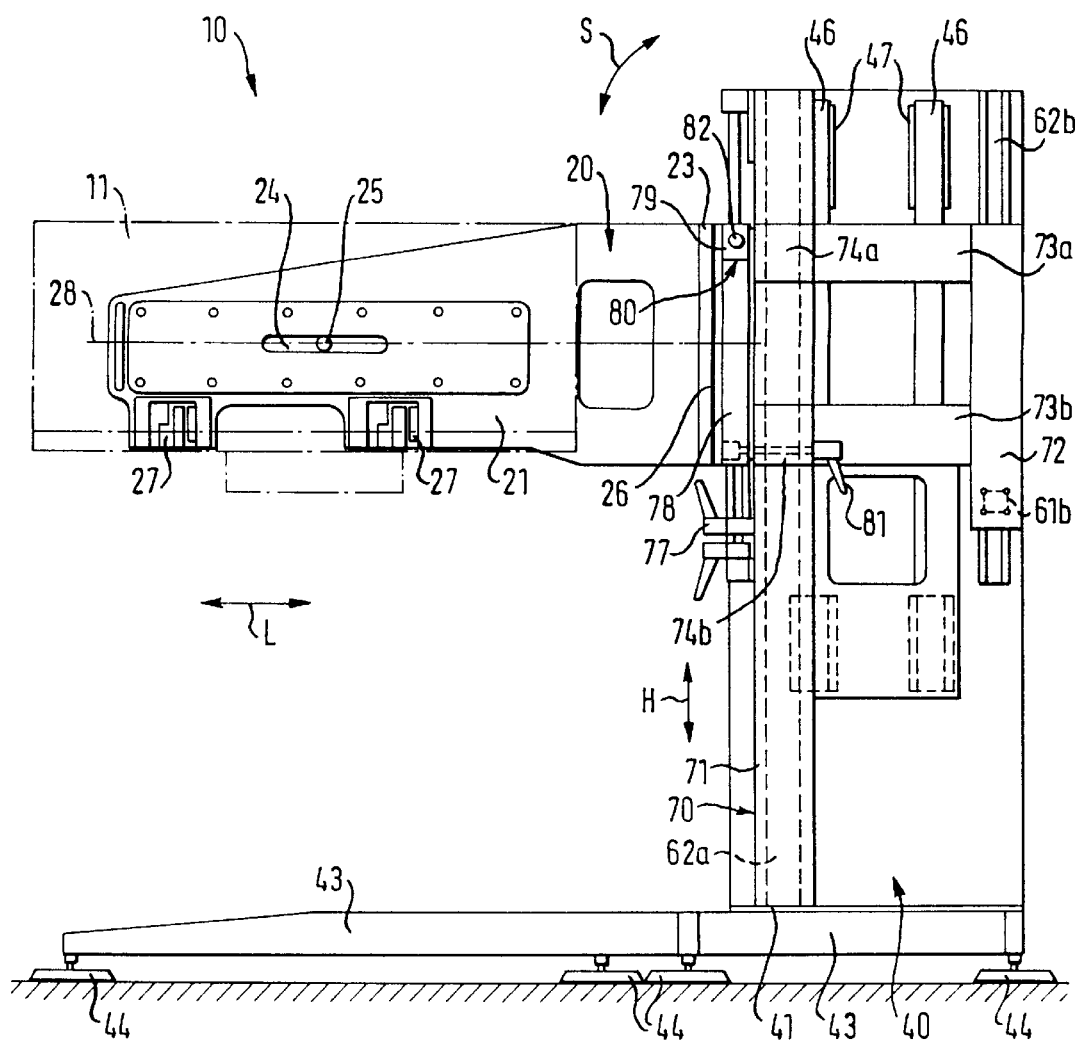
FIG. 2 is a schematic side elevational view of the handling device of FIG. 1.

Referring now to the figures of the drawing in detail and first, particularly, to FIGS. 1 and 2 thereof, there is seen a handling device 10 with a mount 20 in which a test head or test head 11 is inserted. Such a handling device 10 finds application in a wafer tester, which is not illustrated herein for purposes of clarity. The handling device 10 is disposed relative to the wafer tester so that the test head 11 can be assigned to the wafer tester by means of the handling device 10.

The test head 11 is held by the mount 20. The mount 20 comprises side forks 21, 22 connected to each other via an end plate 23. The test head 11 is slidingly held in the longitudinal direction L by the horizontally oriented forks 21, 22. Slots 24 are formed in the forks 21, 22 which define the shiftability in the longitudinal direction L. A corresponding guide pin 25 of the test head 11 engages in the slots 24. The guide pin 25 can be assigned a clamping means for locating the test head 11. The forks 21, 22 comprise further mechanical connecting means 27 via which the test head and the wafer tester can be interlocked. The end plate 23 is formed with an opening through which a cable loom 12 connected to the test head 11 can be guided.

The mount 20 for the test head 11 is rotatably mounted about the longitudinal axis 28 by means of a rotary bearing 26. The rotary position of the mount 20 can be set by means of a non-illustrated latch pin. The rotary bearing 26 is ring-shaped and it comprises an inner opening through which the cable loom 12 of the test head 11 is guided. The cable loom 12 is accommodated by a supporting ring 75 which is swivelable on a supporting arm 76 connected to a supporting part 70 for the mount 20. As a result, a decoupling of the cable loom is achieved. For further decoupling the cable loom 12 further supporting elements may be provided between the supporting ring 75 and the mount 20.

The mount 20 is carried by the supporting part 70 comprising a base portion 73 and a jib portion 74 protruding vertically therefrom.

With specific reference to FIG. 2, the base portion 73 comprises two vertical members 71, 72 mounted via linear bearings 60a, 60b on a frame column 40 of the handling device 10. In this arrangement the vertical member 71 facing the mount 20 is longer that the vertical member 72 spaced away therefrom in parallel. In this exemplary embodiment the vertical member 71 has the same length as the frame column 40.

Each of the linear bearings 60a, 60b consists of a linear bearing rail 62a, 62b and an assigned slide guide 61a, 61b. The linear bearing rails 62a, 62b and the slide guides 61a, 61b are coupled such that the vertical members 71, 72 can move in the vertical direction H relative to the frame column 40 along the side cover panel 42. The linear bearings 60a, 60b thereby permit dimensionally accurate, smooth shifting of the vertical members 71, 72. To enhance the stability the linear bearing rails 62a, 62b and the assigned slide guides 61a, 61b are arranged alternatingly on the two linear bearings 60a, 60b.

The base portion 73 includes two mutually parallel horizontal members 73a, 73b bridging the vertical members 71, 72. In the connecting portion of the horizontal members 73a, 73b with the longer vertical member 71 two cross members 74a, 74b are provided spaced away from each other via which the mount 20 is connected to the supporting part 70. In the exemplary embodiment, the cross members 74a, 74b are perpendicular relative to the horizontal members 73a, 73b.

The position of the supporting part 70 in the vertical direction H can be defined via positioning elements 77. In the exemplary embodiment there are provided two positioning elements 77 which are configured as manually actuatable latch pins.

The individual component parts of the supporting part 70 are made of metal and are welded together to the supporting part 70 in a welding process.

The connection of the mount 20 to the supporting part 70 is achieved by a supporting plate 78. The supporting plate 78 comprises in turn an inner opening through which the cable loom 12 of the test head 11 is guided.

Figure 3:
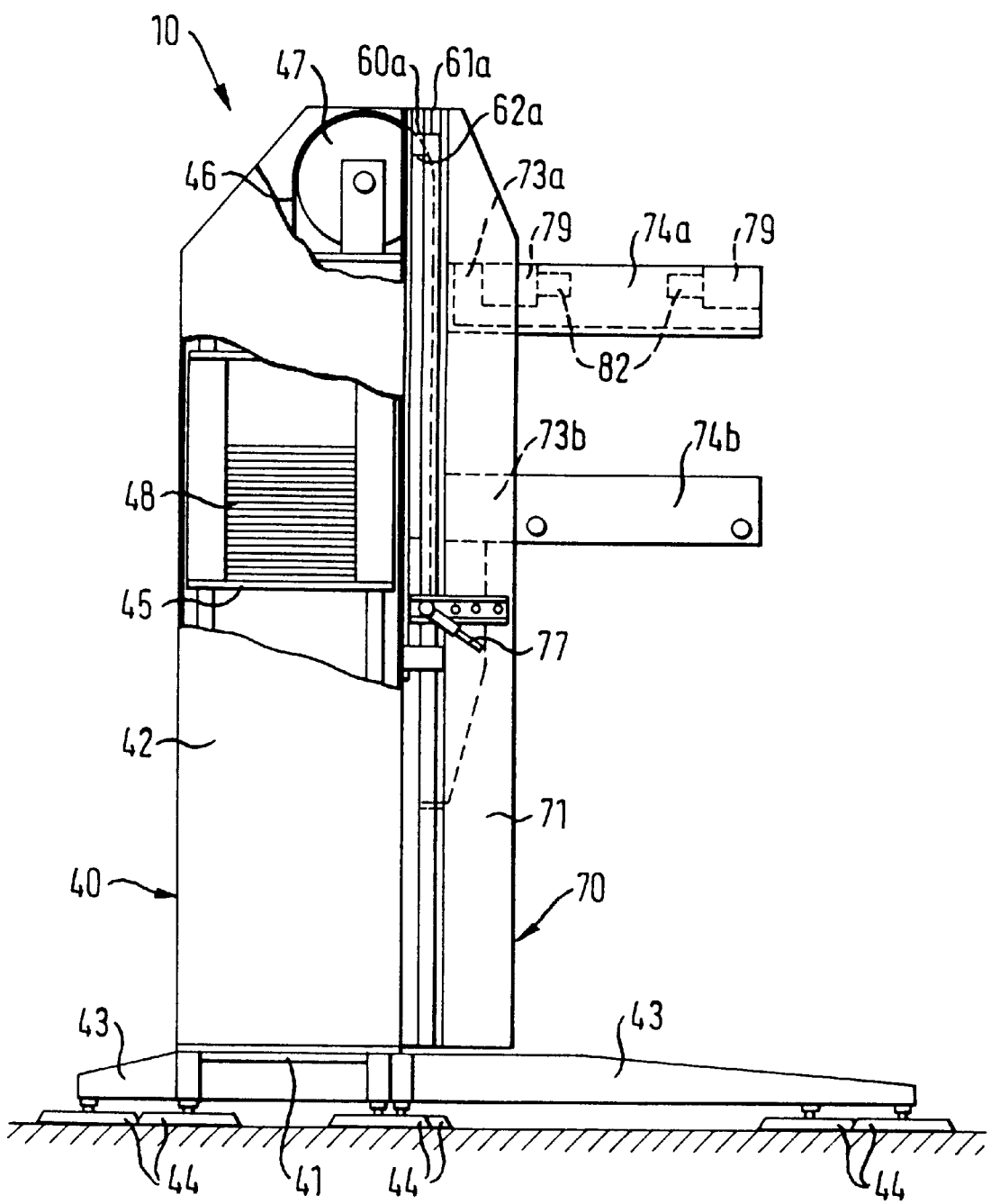
FIG. 3 is a front elevational view of the handling device in which the supporting part is in the down position.

The supporting plate 78 is swivelable on the supporting part 70 via a rotary bearing 79 so that the mount 20 is able to implement a movement in the swiveling direction S. With reference to FIG. 3, the mount 20 is locked at the supporting part 70 via the rotary bearing 79 such that at each upper cross member 74a trunnions 82 are provided. The trunnions 82 cooperate with counterbearings 80 configured on the supporting plate 78. In this way a swivel movement in the direction of the arrow S about the upper cross member 74a is made possible. To define the swivel position of the test head 11 held in the mount 20 positioning elements 81 are provided to adjust the parallel position of the test head 11 relative to the wafer tester.

Again with reference to FIG. 1 the mount 20 is arranged on one side of the frame column 40. In this way the cable loom 12 of the test head 11 is guided on one side of the frame column 40.

A weight balancing device 45 is disposed in the frame column 40. The weight balancing device 45 serves to balance the weight of the test head 11, mount 20 and supporting part 70. With reference to FIG. 3, the weight balancing device 45 comprises balancing weights 48. A plurality of balancing weights 48 are stacked in the weight balancing device 45. Ribbed belts 46 are arranged on the upper side of the weight balancing device 45. The ribbed belts 46 are connected via guide pulleys 47 to the supporting part 70. As shown in FIG. 2 the ribbed belts 46 are each arranged in pairs in the side portions of the weight balancing device 45. This is the reason that paired guide pulleys 47 are available for the ribbed belts.

The frame column 40 comprises in the base portion a base plate 41 on which the jibs 43 are arranged. The jibs 43 comprise in turn in their end portions jib feet 44. It is achieved by the arrangement of the jibs 43 and jib feet 44, that the handling device 10 is very stable and stands safely. At the same time the space taken up by the jibs 43 can be pared to a minimum and, accordingly, the handling device 10 can be installed with substantial space-savings in a clean room. The jibs 43 are telescopically shiftable so that the support of the handling device 10 can be individually adjusted in accordance with the space available in the room and the weight.

Figure 4:
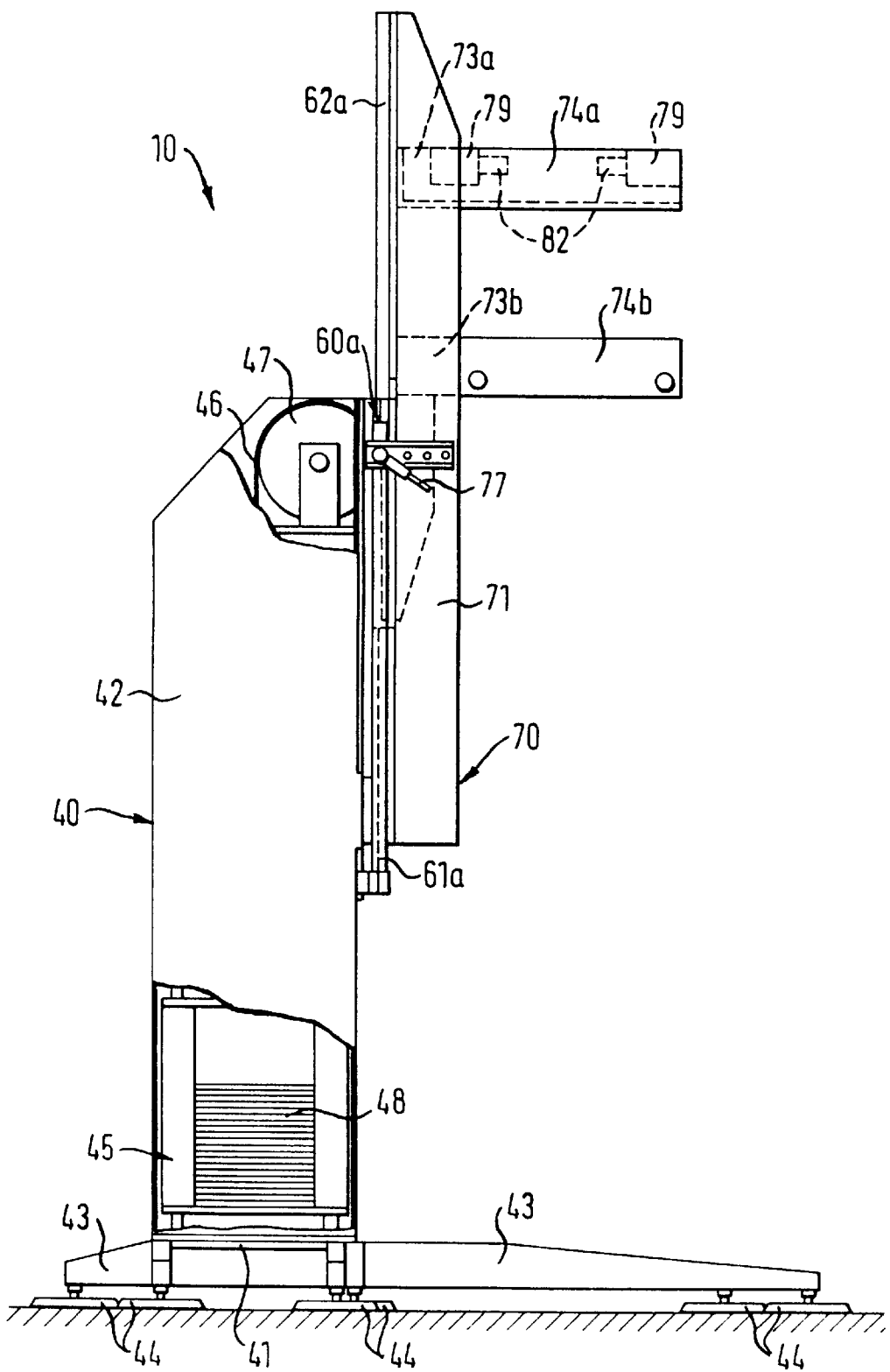
FIG. 4 is a front elevational view with the supporting part in the up position.

With reference to FIGS. 3 and 4, the supporting part 70 can be moved via the vertical members 71, 72 as well as the linear bearings 60a, 60b in the vertical direction relative to the frame column 40 such that the mount 20 and thus also the test head 11 can be run up beyond the free end of the frame column 40. As a result, the height of the frame column can be maintained relatively low for high stiffness. Due to the rail-type configuration of the linear bearings 60a, 60b proper functioning of the supporting part 70 is assured even in the elevated position of the supporting part 70.

Due to the configuration of the handling device 10 the test head 11 can be moved in both the vertical direction H as well as in the longitudinal direction L along the longitudinal axis 28 and also in the swiveling direction S. The movement of the test head 11 in the individual directions can be achieved via a common drive or preferably via separate drives. For this purpose the guide pulleys 47 may be assigned a non-illustrated electric drive for example. The electric drive is controlled by an incremental control so that the test head 11 can be precisely moved. As an alternative a non-illustrated air cylinder may be attached articulatedly to the lower cross member 74b.

The operation of the handling device 10 is as follows:

As noted above, the handling device 10 finds its primary application on a wafer tester. The handling device 10 is thereby located directly alongside the wafer tester so that the test head 11 is oriented above the wafer tester. The test head 11 is disposed at the mount 20 of the handling device 10. The test head 11 can be moved both in the vertical direction H relative to the frame column 40 and in the longitudinal direction L relative to the longitudinal axis 28. In addition, the test head 11 is rotatably mounted about the longitudinal axis 28 by the rotary bearing 26. Furthermore, the test head 11 is rotatably mounted about its transverse axis by means of the rotary bearing 79 in the swiveling direction S. The precise position of the test head 11 can be defined by the positioning elements 77 in the vertical direction H, by the positioning elements 81 in the swiveling direction S, and by the clamping elements cooperating with the guide pin 25 in the longitudinal direction L.

Due to the weight balancing device 45 it is possible with the balancing weights 48 to balance the test head 11, the mount 20, and the supporting part 70. This is achieved by inserting the balancing weights 48 in the weight balancing device 45, thus balancing the supporting part 70 and the parts connected thereto. As a result, only minor forces are needed for adjustment. Furthermore, the configuration is favorable from a technical safety viewpoint, since only very small forces are required to make the adjustment.

The supporting part 70 is adjusted via a non-illustrated electric drive. When the electric drive is combined with a digitizer, highly accurate movement of the test head 11 is enabled.

The supporting part 70 is vertically shifted in the direction H by shifting the weight balancing device 45 within the frame column 40. The supporting part 70 is thereby guided via the linear bearing rail 62a, 62b of the linear bearings 60a, 60b at the assigned slide guide 61a, 61b which are arranged on the side cover panel 42 of the frame column 40.

The rotary movement of the mount 20 about its longitudinal axis 28 is made possible by the rotary bearing 26. In rotation of the mount 20 the cable loom 19 of the test head 11 is decoupled by the supporting ring 75.

The above-described configuration with the weight balancing device permits precise travel of the test head 11 with high reliability. In addition, the handling device 10 takes up very little space which is of advantage for operation in a clean room area. Furthermore, due to the lateral arrangement of the supporting part 70 on the frame column 40 and the generous travel in the vertical direction the test head and the wafer tester are freely accessible on all sides, i.e. also from the rear. This freedom of access has the advantage that servicing as well as repair or maintenance work are facilitated. Due to the design configuration of the handling device 10 it is furthermore assured that the handling device 10 features high stability since the individual components are arranged closely surrounding the frame column 40. Long cantilever components necessitating a particularly complicated support can thus be avoided in the handling device 10 in accordance with the invention.

I claim:

1. A handling device, comprising:
    a frame column;
    at least one linear bearing on said frame column;
    a supporting part connected to said at least one linear bearing and being vertically adjustable along said frame column;
    a mount rotatably supported about its longitudinal axis on said supporting part;
    a weight balancing device for balancing a weight of a test head supported on said mount; and
    said supporting part being formed such that said mount is rigidly disposed and laterally offset relative to said frame column such that the longitudinal axis of said mount does not intersect said frame column.

2. The handling device according to claim 1, including a test head disposed on said mount for testing wafers in a semiconductor clean room.

3. The handling device according to claim 1, wherein said supporting part includes a jib portion projecting laterally from said frame column, said mount being disposed on said jib portion.

4. The handling device according to claim 1, wherein said at least one linear bearing is one of two mutually spaced apart linear bearings linearly guiding said supporting part on said frame column, said linear bearings including linear bearing rails and slide guides alternatingly disposed at said frame column.

5. The handling device according to claim 3, wherein said supporting part includes a base portion guided by said frame column, said jib portion projecting away from said base portion at an angle of substantially 90°.

6. The handling device according to claim 3, wherein said supporting part comprises a base portion guided by said frame column, and a crank connecting said base portion to said jib portion.

7. The handling device according to claim 1, wherein said supporting part comprises two mutually spaced apart vertical members of different lengths.

8. The handling device according to claim 7, wherein said supporting part comprises at least one horizontal member connected to said vertical members.

9. The handling device according to claim 7, wherein said supporting part comprises two horizontal members respectively connected to said vertical members.

10. The handling device according to claim 7, wherein said supporting part further comprises two horizontal members, and two mutually spaced-apart cross members connected to said horizontal members and to said vertical member.

11. The handling device according to claim 10, wherein said cross members are disposed at an angle of 90° relative to said horizontal members.

12. The handling device according to claim 1, wherein said supporting part includes at least one positioning element defining a direction of substantially vertical movement.

13. The handling device according to claim 1, which further comprises a supporting ring swivelably disposed relative to said supporting part, said supporting ring being adapted to accommodate a cable loom of the test head.

14. The handling device according to claim 13, including further supporting means supporting the cable loom between said supporting ring and said test head.

15. The handling device according to claim 1, which further comprises a rotary bearing carrying said mount on said supporting part, said rotary bearing being formed with an inner opening through which a cable loom of the test head is guided.

16. The handling device according to claim 15, wherein said supporting part further comprises two horizontal members, and two mutually spaced-apart cross members connected to said horizontal members and to said vertical member, and a supporting plate disposed on said cross members and connected to said rotary bearing.

17. The handling device according to claim 16, wherein said supporting plate has an inner opening formed therein through which the cable loom is guided, said supporting plate being swivelably carried on said cross member.

18. The handling device according to claim 17, which further comprises a rotary bearing swivelably carrying said supporting plate on said upper cross member.

19. The handling device according to claim 17, which further comprises a rotary bearing formed with a trunnion arranged on said supporting plate and a counterbearing arranged on said cross member.

20. The handling device according to claim 16, which further comprises a locking element for locking said supporting plate in a locked position along a swiveling movement direction thereof.

21. The handling device according to claim 16, wherein said vertical members, said horizontal members, and said cross members are made of metal.

22. The handling device according to claim 21, wherein said vertical members, said horizontal members, and said cross members are welded to each other.

23. The handling device according to claim 1, wherein said mount comprises two forks and an end plate interconnecting said two forks.

24. The handling device according to claim 23, wherein each of said forks has a slot formed therein for receiving guide pins on said test head, said slots defining a longitudinal movement of the test head.

25. The handling device according to claims 23, which further comprises mechanical connectors on said forks for locking the test head to a wafer tester.

26. The handling device according to claim 1, wherein said weight balancing device is arranged within said frame column.

27. The handling device according to claim 1, wherein said weight balancing device includes at least one balancing weight, at least one guide pulley, and at least one ribbed belt guided over said guide pulley and connecting said balancing weight to said supporting part.

28. The handling device according to claim 27, wherein said at least one ribbed belt is one of two mutually parallel ribbed belts each connected to said supporting part and said at least one guide pulley is one of two guide pulleys each guiding a respective one of said ribbed belts.

29. The handling device according to claim 1, wherein said frame column includes a base plate carrying at least one jib, and at least one jib foot of said at least one jib.

* * * * *